United States Patent [19]

Feigt et al.

[11] Patent Number: 4,554,453
[45] Date of Patent: Nov. 19, 1985

[54] APPARATUS FOR RECORDING X-RAY IMAGES

[75] Inventors: Ingmar Feigt, Langensendelbach; Hans Heinrich, Erlangen; Karl Kempter, Munich, all of Fed. Rep. of Germany

[73] Assignee: Siemens Aktiengesellschaft, Berlin and Munich, Fed. Rep. of Germany

[21] Appl. No.: 594,090

[22] Filed: Mar. 28, 1984

[30] Foreign Application Priority Data

Apr. 5, 1983 [DE] Fed. Rep. of Germany ....... 3312264

[51] Int. Cl.$^4$ .......................... G01T 1/20; G01T 1/24
[52] U.S. Cl. ............................. 250/327.2; 250/361 R; 250/370; 250/213 R
[58] Field of Search ................ 250/370, 213 R, 484.1, 250/327.2, 315.3, 361 R

[56] References Cited

U.S. PATENT DOCUMENTS 3,069,551 12/1962 Haine ............................. 250/213 R
3,348,056 10/1967 Kohashi ......................... 250/213 R
4,059,766 11/1977 Rougeot ............................ 250/370
4,176,275 11/1979 Korn et al. ...................... 250/213 R
4,508,966 4/1985 Oberschmid et al. ........... 250/484.1

Primary Examiner—Alfred E. Smith
Assistant Examiner—Carolyn E. Fields
Attorney, Agent, or Firm—Mark H. Jay

[57] ABSTRACT

The invention relates to an apparatus for the taking of X-ray pictures, where there are between two radiation-transmitting electrodes two solid substance layers whose free sides lie in a charge storage layer. The first electrode is a photo-conducting layer which is impinged upon by image rays, while the second electrode is a photo-conducting layer which is impinged upon by an optical ray moved in a scanning raster, so that a reproducible signal is obtained. According to the invention, the time required per image is reduced and increased quantum yield is achieved at increased signal-to-noise ratio and greater dynamic range. There is correlated to the first photo-conducting layer a luminophor which transforms the image rays into light which is preferentially absorbed in this layer. An apparatus according to the invention is usable in particular in medical radio-diagnostics.

12 Claims, 1 Drawing Figure

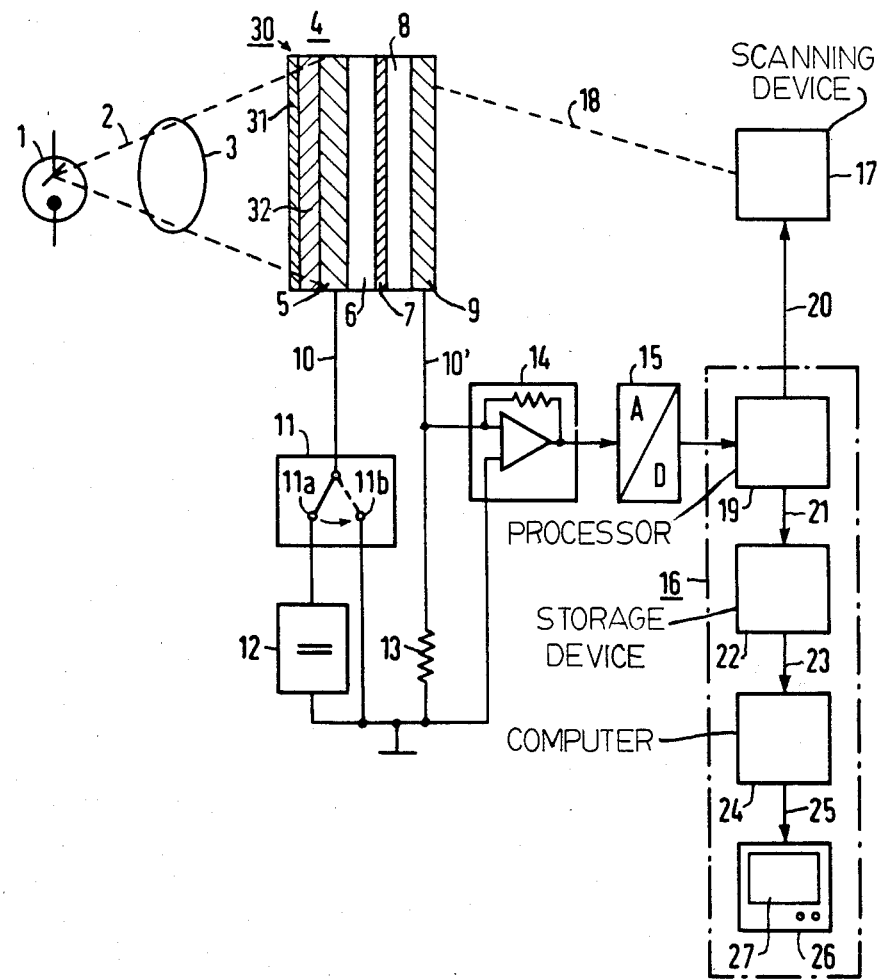

APPARATUS FOR RECORDING X-RAY IMAGES

BACKGROUND OF THE INVENTION

This invention is related to an apparatus for recording X-ray images. An apparatus of this type is known for instance from U.S. Pat. No. 3,069,551.

The known devices, which operate as image intensifiers with an image recording and reproducing system have the purpose of providing an improved electrical installation for generating a high lighted visualization of an image which is derived from or produced by a radiation source. Such an image intensifier consists or an image recording system which can deliver an electric pulse sequence corresponding to the image, and of an image reproducing system which transforms these pulses into an image. The latter system corresponds to a large extent with the television reproduction devices common today.

The recording system consists of two panel type radiation-transmitting electrodes and, in direct contact with them, two solid layers in intimate area contact with each other, one layer consisting of a photoconductive substance while the second layer consists of an electrically insulating substance which is able to store electric charges, and where the photoconductive layer is impinged upon both by the rays of the image to be intensified and by rays of a light source scanning the entire image area optically according to a specified raster. But such devices have not been successful because charge storage at an interface is still difficult if it is to operate with the necessary homogeneity and reproducibility. In addition, a large scanning time is required, so that with the known arrangement pictures of moving organs can hardly be obtained.

More recently proposals have appeared according to which layers consisting of phosphorescent materials are to be used as storage elements. That is, luminophors are to be used which, when exposed to high-energy radiation, are excited as a function of the intensity of these rays, and as such are suitable for storing this excitation. Such arrangements are described e.g. in U.S. Pat. Nos. 3,859,527 and 3,975,637. Both methods are based on utilizing the effect of the light-stimulated luminescence, i.e. transforming the X-ray light by way of a luminescent screen into visible light first. The brightness-modulated image is then stored in the form of excited electron states in traps in a connected or in the same phosphor. The optic-electrical reading or conversion occurs thereafter by local scanning of the phosphor with a luminous spot through the effect of light-stimulated or thermo-stimulated "exposure". The emitted light is transformed by an optoelectric detector into electrical signals, which can be visualized in the manner common in television. A disadvantage here is that, apart from other losses, the storage effect itself reaches an efficiency of at most 10%.

The scanning—to be carried out in a raster system—of the total area of the recording medium by means of a luminous spot requires, however, a free space in front of the phosphor layer. For this reason the optoelectric detector or a preceding focusing lens must be arranged at a great distance from the light-emitting area of the phosphor. Thus only a small portion of the light intensity activated during scanning is picked up by the optoelectric detector. This leads additionally to an undesirably small signal to noise ratio and to a small dynamic range.

SUMMARY OF THE INVENTION

It is an object of the invention to disclose an apparatus for recording X-ray images in less time per image and with increased quantum yield at an increased signal/noise ratio and an increased dynamic range.

Accordingly, in contrast to the film-foil combination common until now in medical radiography, there is to be used instead of the photosensitive film a photoconductive apparatus which produces and stores electric charge images, which is in direct contact with the luminescent screen (intensifier foil). The luminescent screen lies outside the electrical field across the photoconductive apparatus. The charge-storing photoconductive apparatus is to be read out photoelectrically by one (or more) serially scanning light beam(s). It thus forms the basis for a large-area sensor for a digital X-ray camera. Th storage here occurs in a semiconductor in the form of charge carriers which are trapped in energized deep trays. These traps can be formed by surface states or volume states in semiconductor or insulators.

Since here, in recording, the light is stored electrically and not in delaying phosphors, the high efficiency of the luminescent screen can be used with greater efficiency for the stimulation of the optoelectric detector. When using a rare earth intensifier foil, for instance one with lanthanum oxibromide material, the efficiency reaches a value in the order of 20%, and for barium fluorochloride (BaFCl) foil a value of 10%. The main advantage of the invention consists in the practically complete reception of the light emitted by the luminescent layer of the intensifier foil by the photoconductor, which is in direct contact with the light-emitting surface. The advantage over the photo-film consists (besides the replacement of the sensitive layer) in that here the dynamic range is not restricted by a gray fog as occurs in film; that a wet chemistry developing process is not necessary; and that working with silver halide is avoided.

For semiconductor layers used in radiograph, e.g. layers of selenium, for use in xeroradiography, the use of intensifier foils has not been adopted. This is evidently due to the fact that intensifier foils proved insufficiently resistant to the voltages of several thousands of volts common in xeroradiography. Therefore, according to the invention, the luminescent layer in storage X-ray image converters with optoelectrical readable semiconconductor layers was arranged so that the luminescent layer remains field-free, i.e. outside the space limited by electrodes. In the photo-film applications the intensifier foils were used primarily for the purpose of transforming the X-rays into more readily absorbable light, so as to obtain a substantial reduction in the exposure time.

In converting X-ray intensity into light intensity, the luminescent screen (intensifier foil) ensures a dynamic range of at least 60 dB, i.e. at least 1000 grays levels; but often, up to 100 dB are reached. The photoconducting layer records (registers) the light emanating from the luminophor, i.e. the luminescent layer of the intensifier foil, in that at the exposure areas, depending on their intensity at impressed bias voltage an electric charge flows which gets into the intermediate storage layer. There the charge is retained. Hence the charge pattern thus formed corresponds in its local distribution to the pattern of the intensity of the X-ray image to the reproduced. It is nonvolatile and remains stored even after the voltage supply is turned off. It is necessary to turn off the voltage supply because otherwise the later occurring dark current would impair the contrast of the image data.

In a further step, by scanning with a light beam, so-called light spot scanning, via the locally conducting photoconductor layer, point for point can be picked up in an externally closed circuit, e.g. by a charge-sensitive intensifier.

To reduce stray capacitances and dark current, it may be advantageous to subdivide in suitable manner also the area of the sensor. Such a subdivision can be obtained e.g. by introducing a strip type contacting to the area to be scanned in which the individual strips are electrically separated from each other. For the subdivision it is important that parasitic capacitances of the sample are smaller than the effective capacitance of the charge intensifier.

The arrangement permits the realization of rapidly changing X-ray images if there is used as photoconductor a material which has a correspondingly rapid rise and fall time of the photo current. Such materials comprise e.g. amorphous selenium, which as a rule contains 0.1 to 5% additives, such as arsenic (As) or tellurium (Te), or amorphous hydrogen-containing silicon. On layers on these photo-conductors which are several microns thick transmit times of the charge carriers of less than 1 microsecond duration have been measured. This means that e.g. an image size of 25×25 cm can be read in less than 1 second if one limits oneself to a resolution of 2 line pairs per m.

In setting up an apparatus according to the invention it has proven appropriate to use amorphous arsenic trisulfide or triselenide ($As_2S_3$ or $As_2Se_3$) as material of the storing intermediate layer. When designating the arrangement with semiconductors of the above mentioned kind, approximately 1 micron thick layers of these semiconductor materials have proved favorable. The layer combination can then be provided at its two outer sides with a 10 to 100 nm thick layer of indium-tin oxide or gold as electrode.

The luminophor in the luminescent layers to be used should be selected so that it can have an optimal effect on the semiconductor of the recording arrangement. When using selenium as semiconductor, gadolinium oxysulfides (GdOS) and barium fluorochloride (BaFCl) have proved especially favorable as luminophors for the intensifier foils to be used. The thickness of the luminescent layer should be of an order of magnitude of less than 100 microns. It must be taken into consideration here, however, that the light yield depends on the thickness of the layer, but that with increasing thickness a less sharp image is to be expected.

Other features and advantages of the invention will be apparent from the following description of the preferred embodiments, and from the claims.

For a full understanding of the present invention, reference should now be made to the following detailed description of the preferred embodiments of the invention and to the accompanying drawing.

BRIEF DESCRIPTION OF THE DRAWING

The FIGURE shows a general block diagram of a recording system designed according to the invention.

DETAILED DESCRIPTION

In the FIGURE, 1 denotes an X-ray source, from which a cone of rays 2 passes through a patient 3. The fluoroscopic image thus produced gets into a recording arrangement 4 according to the invention. This arrangement 4 consists for instance of a 1 mm thick aluminum (Al) plate serving as a transparent carrier and an electrode 5; an X-ray semiconductor layer 6 applied thereto; a storing intermediate layer 7 lying on the latter; a photoconductor layer 8; and an electrode 9. The layers 6 and/or 8 may be selenium (Se). Preferably, the selenium is in an amorphous form and is in a layer which is between 0.1 to 30 microns thick, and stabilizers are preferably added. The stabilizers may be tellurium (Te), hydrogen-containing amorphous silicon, or 0.1% to 5% arsenic.

The two electrodes 5 and 9 are connected via lines 10 and 10' as well as a switch 11 with switch positions 11a and 11b to a voltage 12 for the generation of a voltage field magnitude in the order of $10^4$ and $10^5$ volts. In addition, the lines 10 and 10' are connected to a resistor 13 and to an intensifier 14. The latter is connected via an analog/digital converter 15 to processing equipment 16 for handling the image signals. The processing equipment is also connected to a scanning device 17, from which originates a fine light ray 18 through the electrode 9, scanning the photoconductor layer 8 of the recording 4.

The equipment 16 contains a processor 19, into which the signal passes from the analog/digital converter 15. Through the processor a control signal is supplied via a line 20 the scanning device 17 for control of the scanning movement of ray 18. In addition, the signal is conducted via a connection 21 to a storage device 22, from which the image signal can be supplied via a line 23 to a computer 24. Finally, the signal passes via a line 25 to a television monitor 26, where it can be made visible on an image screen 27.

Applied on the outside of electrode 5 is an intensifier foil (VF) 30. It consists of an X-ray transmitting support 31 of aluminum or plastic and a luminescent layer 32 of, preferably, a rare-earth luminophor, such as lanthanum oxybromide (LaOBr), activated gadolinium oxysulfides (GdOS), barium fluorochlorides (BaFCl) or cesium iodide (CaI).

The acquisition of an X-ray image can be performed for instance in the following steps:

Step 1: 100 V is applied at the electrodes 5 and 9 and exposure by means of the beam 2 and light from VF 30 is effected.

Step 2: A brief shortcircuit is generated by positioning switch 11 to 11b for discharging the electrodes 5 and 9.

Step 3: The arrangement is stored in the dark (about 1 hour) with the electrodes 5 and 9 left in the open position.

Step 4: The electrodes 5 and 9 are connected to the intensifier 14 and scanning with fine light ray 18 for read-out takes place.

After passing through the converter 15 and performance of the known processing in the equipment 16, the fluoroscopic image of the patient 3 can appear on the screen 27 of the monitor 26 from the read-out signals. The image editing and television system indicated in the equipment 16 may be designed in a manner known in itself in digital X-ray technology, as described for instance in "Röntgenpraxis" 6 (1981), pages 239 to 246, so that, additionally, changes of brightness, contrast, etc. of the X-ray image become possible.

There has thus been shown and described a novel appparatus for recording X-ray images which fulfills all the objects and advantages sought therefore. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. An improvement to a solid image recording system of the type which contains first and second radiation-transmitting electrodes, first and second photoconducting layers each contacting a corresponding one of the electrodes, and a central charge-storing layer which is disposed between the photoconducting layers and which contacts both of them, wherein the first photoconducting layer is impinged by image rays and the second photoconducting layer is impinged by an optical ray moved in a scanning raster, the improvement comprising a luminophor which is associated with the first photoconductive layer and transforms the image rays into light which is preferentially absorbed in the first photoconductive layer, the luminophor being located outside any electric field existing between the electrodes.

2. The improvement of claim 1, wherein the luminophor is disposed in a separate layer.

3. The improvement of claim 2, wherein said first electrode is transparent to light and said separate layer contacts said first electrode.

4. The improvement of claim 1, wherein the recording system is of a type in which X-ray images are converted into electrical signals and in which a voltage is applied across the electrodes during recording of an image to collect charge carriers in the charge-storing layer, wherein the recording system further includes means for scanning the second photoconducting layer with a light ray, and wherein the luminophor transforms X-rays into light.

5. Recording system according to claim 4, wherein at least one of said photoconductors comprise selenium (Se) and wherein said luminophor comprises rare-earth luminophors.

6. Recording system according to claim 5, wherein said luminophor is lanthanum oxybromide (LaOBr).

7. Recording system according to claim 5, wherein said luminophor is barium fluorochloride (BaFCl).

8. Recording system according to claim 5, wherein said luminophor is cesium iodide (CsI).

9. Recording system according to claim 1, wherein one of said photoconductors is comprised of a 0.1 to 30 micron thick layer of amorphous selenium provided with stabilizing additions.

10. Recording system according to claim 9, wherein said additions comprise 0.1 to 5% arsenic.

11. Recording system according to claim 9, wherein said additions comprise tellurium (Te).

12. Recording system according to claim 9, wherein said additions comprise hydrogen-containing amorphous silicon.

* * * * *